US012701682B2

(12) United States Patent
Garrabrant et al.

(10) Patent No.: US 12,701,682 B2
(45) Date of Patent: Aug. 4, 2026

(54) COOLING SYSTEM FOR POWER ELECTRONICS UNITS

(71) Applicant: Caterpillar Inc., Peoria, IL (US)

(72) Inventors: Michael Robert Garrabrant, Dunlap, IL (US); Eric Matthew Andris, Dunlap, IL (US)

(73) Assignee: Caterpillar Inc., Peoria, IL (US)

( * ) Notice: Subject to any disclaimer, the term of this patent is extended or adjusted under 35 U.S.C. 154(b) by 294 days.

(21) Appl. No.: 18/638,888

(22) Filed: Apr. 18, 2024

(65) Prior Publication Data

US 2025/0331138 A1     Oct. 23, 2025

(51) Int. Cl.
*H05K 7/20* (2006.01)

(52) U.S. Cl.
CPC ......... *H05K 7/209* (2013.01); *H05K 7/20927* (2013.01); *H05K 7/20945* (2013.01)

(58) Field of Classification Search
CPC . H05K 7/209; H05K 7/20927; H05K 7/20945
USPC ........................................................ 361/702
See application file for complete search history.

(56) References Cited

U.S. PATENT DOCUMENTS

| | | | | |
|---|---|---|---|---|
| 6,457,515 | B1 * | 10/2002 | Vafai | H10W 40/47 |
| | | | | 257/E23.098 |
| 9,095,078 | B2 * | 7/2015 | Chainer | H05K 7/20772 |
| 10,178,813 | B2 * | 1/2019 | Boteler | H05K 7/2089 |
| 10,499,488 | B1 | 12/2019 | Tsai et al. | |
| 2011/0042038 | A1 * | 2/2011 | Herron | H05K 7/20927 |
| | | | | 165/104.11 |
| 2014/0198453 | A1 * | 7/2014 | Zhang | H05K 7/20927 |
| | | | | 361/699 |
| 2023/0255004 | A1 * | 8/2023 | Kloetzig | H05K 5/0069 |
| | | | | 361/760 |
| 2023/0284377 | A1 * | 9/2023 | Zhou | H05K 1/0272 |
| | | | | 361/699 |

FOREIGN PATENT DOCUMENTS

| | | |
|---|---|---|
| CN | 212850219 U | 3/2021 |
| CN | 113825309 B | 7/2023 |
| DE | 202013012008 U1 | 1/2015 |
| FR | 2978872 B1 | 1/2016 |
| JP | 2015133471 A | 7/2015 |

* cited by examiner

*Primary Examiner* — Zhengfu J Feng
(74) *Attorney, Agent, or Firm* — Obhan

(57) ABSTRACT

A cooling system for a power electronics unit includes a heatsink arrangement and multiple blocks. The heatsink arrangement includes first and second heatsinks to receive a coolant flow. The first heatsink includes first openings and the second heatsink includes second openings. Blocks are positioned between the heatsinks. Each block defines a flow regulation feature such that coolant flows between the first and second openings is selectively routed and restricted. One block is swappable with another block to interchange locations of flow regulation features to switch the cooling system between first and second configurations. In the first configuration, the heatsinks are fluidly connected to each other to receive the coolant flow according to a series flow. In the second configuration, the heatsinks are fluidly connected to each other to receive the coolant flow according to a parallel flow.

20 Claims, 5 Drawing Sheets

COOLING SYSTEM FOR POWER ELECTRONICS UNITS

TECHNICAL FIELD

The present disclosure relates to power electronics units with power modules and cooling systems for the same. More particularly, the present disclosure relates to heatsinks that can be fluidly coupled to each other to receive a coolant flow either in series or in parallel.

BACKGROUND

Power electronics units may be utilized in a variety of applications. As an example, in machines, one or more power modules of a power electronics unit may be applied to convert and/or condition a direct current (DC) incoming from a power producing device (e.g., a battery) into an alternating current (AC) for supply to a power consuming device (e.g., a traction motor). In such applications, the power modules may be thermally coupled to a cooling system such that heat from the power modules may be dissipated and working temperatures of the power modules may be maintained.

Depending upon areas of application of the power modules and/or their types, cooling capacities of the cooling systems may be differently calibrated. However, calibrating cooling systems based on different cooling capacities generally warrants that several parts of those cooling systems be readily available when manufacturing the cooling systems. A requirement for several parts to be available during a manufacturing process increases inventory, leading to commensurate increase in costs, labor, and time needed to manufacture a cooling system.

Chinese Patent Publication No.: CN212850219U relates to a converter power pack including a power module mounted on a mounting bracket. A series media path is formed between a first media port, a chassis cooling cavity, an arm inlet cavity, an arm outlet cavity, and a second media port. A parallel media path may also be formed between the first media port, the chassis cooling cavity, the arm inlet cavity, the arm outlet cavity, and the second media port.

SUMMARY OF THE INVENTION

In one aspect, the disclosure is directed to a cooling system for a power electronics unit, the cooling system includes a heatsink arrangement and multiple blocks. The heatsink arrangement includes a first heatsink and a second heatsink. Each of the first heatsink and the second heatsink is configured to receive a coolant flow and dissipate heat from one or more power modules of the power electronics unit. The first heatsink includes a number of first openings and the second heatsink includes a number of second openings. The blocks are positioned between the first heatsink and the second heatsink. Each block defines a flow regulation feature such that coolant flows correspondingly between the first openings and the second openings is selectively routed and restricted. At least one block is swappable with at least one another block to interchange locations of a first flow regulation feature of one block with a second flow regulation feature of another block to switch the cooling system between a first configuration and a second configuration. In the first configuration, the first heatsink and the second heatsink are fluidly connected to each other to receive the coolant flow according to a series flow, and, in the second configuration, the first heatsink and the second heatsink are fluidly connected to each other to receive the coolant flow according to a parallel flow.

In another aspect, the disclosure relates to a method for assembling a cooling system for a power electronics unit. The method includes using a heatsink arrangement including a first heatsink and a second heatsink. Each of the first heatsink and the second heatsink is configured to receive a coolant flow and dissipate heat from one or more power modules of the power electronics unit. The first heatsink includes first openings and the second heatsink includes second openings. The method further includes positioning a number of blocks between the first heatsink and the second heatsink. Each block defines a flow regulation feature such that coolant flows correspondingly between the first openings and the second openings is selectively routed and restricted. At least one block is swappable with at least one another block to interchange locations of a first flow regulation feature of one block with a second flow regulation feature of another block to switch the cooling system between a first configuration and a second configuration. In the first configuration, the first heatsink and the second heatsink are fluidly connected to each other to receive the coolant flow according to a series flow, and, in the second configuration, the first heatsink and the second heatsink are fluidly connected to each other to receive the coolant flow according to a parallel flow.

In yet another aspect, the disclosure is directed to a machine. The machine includes at least one power producing device and at least one power consuming device. The machine also includes a power electronics unit configured to convert and condition a flow of electrical current between the power producing device and the power consuming device. The power electronics unit includes one or more power modules and a cooling system to maintain a working temperature of the one or more power modules of the power electronics unit. The cooling system includes a heatsink arrangement including a first heatsink and a second heatsink. Each of the first heatsink and the second heatsink is configured to receive a coolant flow and dissipate heat from the power modules of the power electronics unit. The first heatsink includes first openings and the second heatsink includes second openings. Blocks are positioned between the first heatsink and the second heatsink. Each block defines a flow regulation feature such that coolant flows correspondingly between the first openings and the second openings is selectively routed and restricted. At least one block is swappable with at least one another block to interchange locations of a first flow regulation feature of one block with a second flow regulation feature of another block to switch the cooling system between a first configuration and a second configuration. In the first configuration, the first heatsink and the second heatsink are fluidly connected to each other to receive the coolant flow according to a series flow, and, in the second configuration, the first heatsink and the second heatsink are fluidly connected to each other to receive the coolant flow according to a parallel flow.

DETAILED DESCRIPTION

Reference will now be made in detail to specific embodiments or features, examples of which are illustrated in the accompanying drawings. Generally, corresponding reference numbers may be used throughout the drawings to refer to the same or corresponding parts, e.g., 1, 1', 1", 101 and 201 could refer to one or more comparable components used in the same and/or different depicted embodiments.

Figure 1:
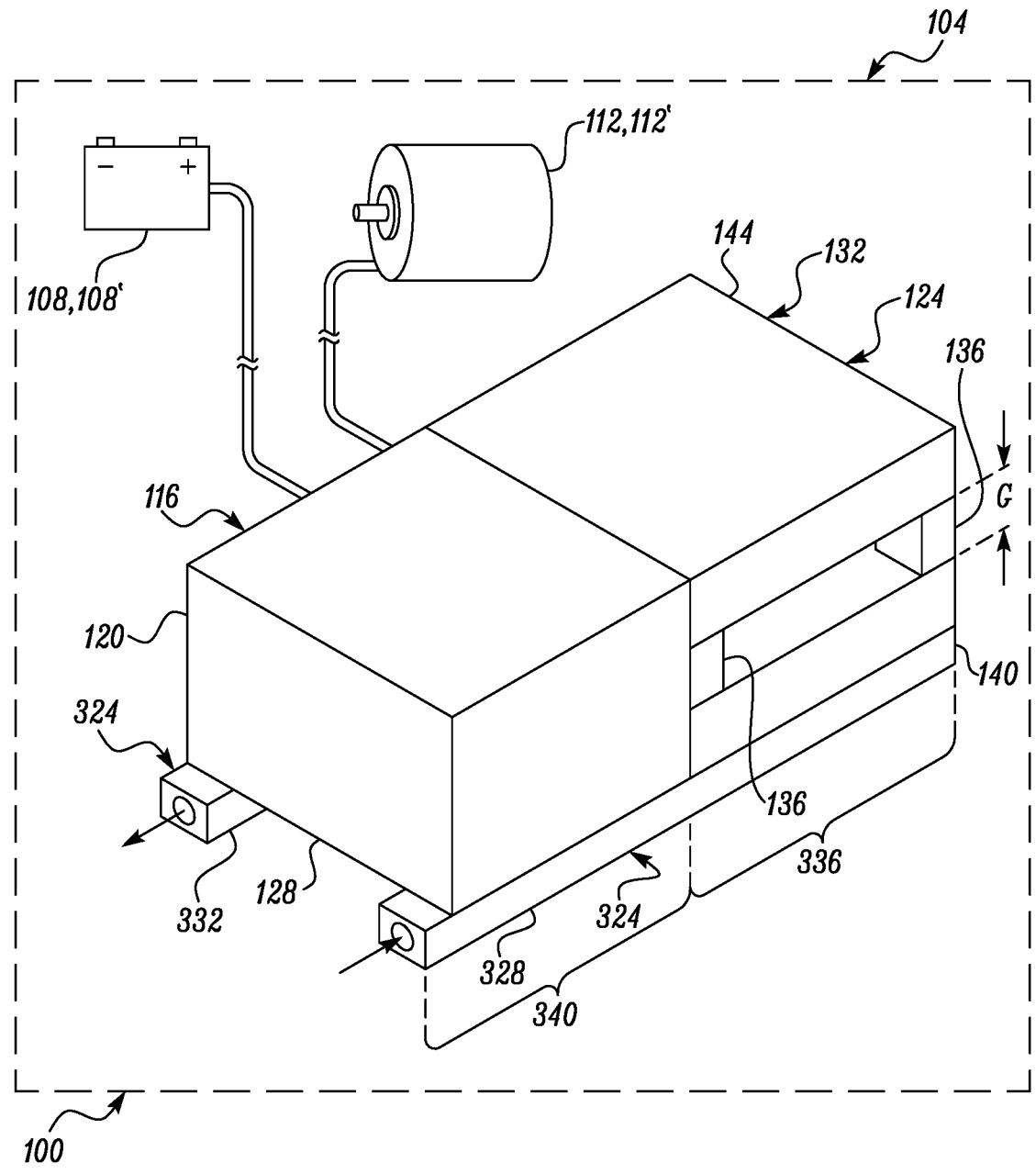
FIG. 1 is a diagrammatic view of an environment of a machine having a power electronics unit and a cooling system for the same, in accordance with an embodiment of the present disclosure.

Referring to FIG. 1, an exemplary environment 100 is shown within which aspects of the present disclosure may be exemplarily applied. The environment 100 may correspond to a machine environment, and thus may include or represent a machine 104. The machine 104 may include a mobile work machine, such as, but not limited to, an excavator, a loader, a scraper, a planer, a grader, and/or the like machines. Aspects of the present disclosure may also be suitably applied to various other machines, such as stationery machines, e.g., generator sets that may be applicable in domestic or commercial establishments or at any relevant site, e.g., for power production, etc. Effectively, the aspects of the present disclosure are not restricted to any particular machine type.

The machine 104 may include a power producing device 108, such as a battery 108', that may produce electrical power. The machine 104 may also include a power consuming device 112, such as a traction motor 112', that may consume the electrical power produced by the power producing device 108, e.g., for being actuated. In the case of the power consuming device 112 being the traction motor 112', the traction motor 112' can source power produced by the power producing device 108 (e.g., the battery 108') so as to be actuated (e.g., to be run and/or rotated), to facilitate a motion of the machine 104 across an expanse of a worksite.

With continued reference to FIG. 1 and also in conjunction with FIGS. 2 through 5, the machine 104 may include a power electronics unit 116, as shown. The power electronics unit 116 may include one or more electrical components 120 and a cooling system 124 for the power electronics unit 116. The cooling system 124 may be applied for cooling the electrical components 120. The electrical components 120 may include one or more power modules 128. Although not limited, the power modules 128 may be in the form of insulated gate bipolar transistor ("IGBT") modules, which may be among those that are well known and widely used and applied in electrical power systems of various machines. As an example, the power modules 128 may be applied for switching power in a power converter (not shown) in any suitable manner, known to those skilled in the art.

Additionally, or optionally, the electrical components 120 may also include capacitors (e.g., in the form of a capacitor sub-assembly), that may be applied along with other devices, such as fuses, relays, switches, safety disconnect units, and the like. One or more of such devices may function in unison or in concert with one or more of the other such devices (e.g., of the power electronics unit 116 and/or otherwise) (e.g., in a known manner) to convert and/or condition a flow of an electrical current between the power producing device 108 and the power consuming device 112. In other words, electrical current may flow from the power producing device 108 to the power consuming device 112 to run the power consuming device 112, and, said electrical power for supply to the power consuming device 112 may be conditioned and/or converted (e.g., D/C to A/C) (Direct Current to Alternating Current) by the power electronics unit 116 prior to its delivery to the power consuming device 112.

During operations of the machine 104, the power electronics unit 116 may be functional and accordingly various parts of the power electronics unit 116, such as the power modules 128, may generate heat. Such heat may be required to be thermally regulated, dissipated, and/or vented out of the power electronics unit 116 for longevity and durable running of the power electronics unit 116 and/or of the power modules 128, so as to in turn run the machine 104 and/or its functions thereof. To this end, the cooling system 124, noted above, may be applied to cool the power modules 128 and thus help maintain a working temperature of the power modules 128.

Referring to FIGS. 2 through 5, the cooling system 124, and its various embodiments, are discussed. The cooling system 124 may include a heatsink arrangement 132 and a number of blocks 136. The cooling system 124 may further include a coolant a flow of which may be regulated (e.g., by a pump) to enable a circulation of the coolant through each of the heatsink arrangement 132 and the blocks 136. Additionally, the cooling system 124 may include parts that may be disposed in an underlying relationship to the power modules 128 of the power electronics unit 116. In this regard, the cooling system 124 may include a heat dissipation structure (not shown) that may be positioned in contact with and/or under the power modules 128. The heat dissipation structure may include one or more of fins and/or surfaces that may come in contact with and/or interact with a coolant flow such that heat from the power modules 128 may be extracted via the heat dissipation structure and then transferred or passed to the coolant flow for achieving heat dissipation.

During operations of the cooling system 124, the coolant may be pressurized (e.g., by the above noted pump) and circulated throughout various parts of the cooling system 124, e.g., the heatsink arrangement 132, the blocks 136, and also through and/or across the heat dissipation structure. In that manner, the coolant flow may extract heat from the heat dissipation structure (e.g., heat from the power modules 128), travel to the heatsink arrangement 132, dump the heat at the heatsink arrangement 132, and be ready for a next cycle of circulation back to the heat dissipation structure to extract additional heat from the power modules 128 via the heat dissipation structure. Details related to each of the heatsink arrangement 132 and the blocks 136 shall now be discussed.

Figure 2:
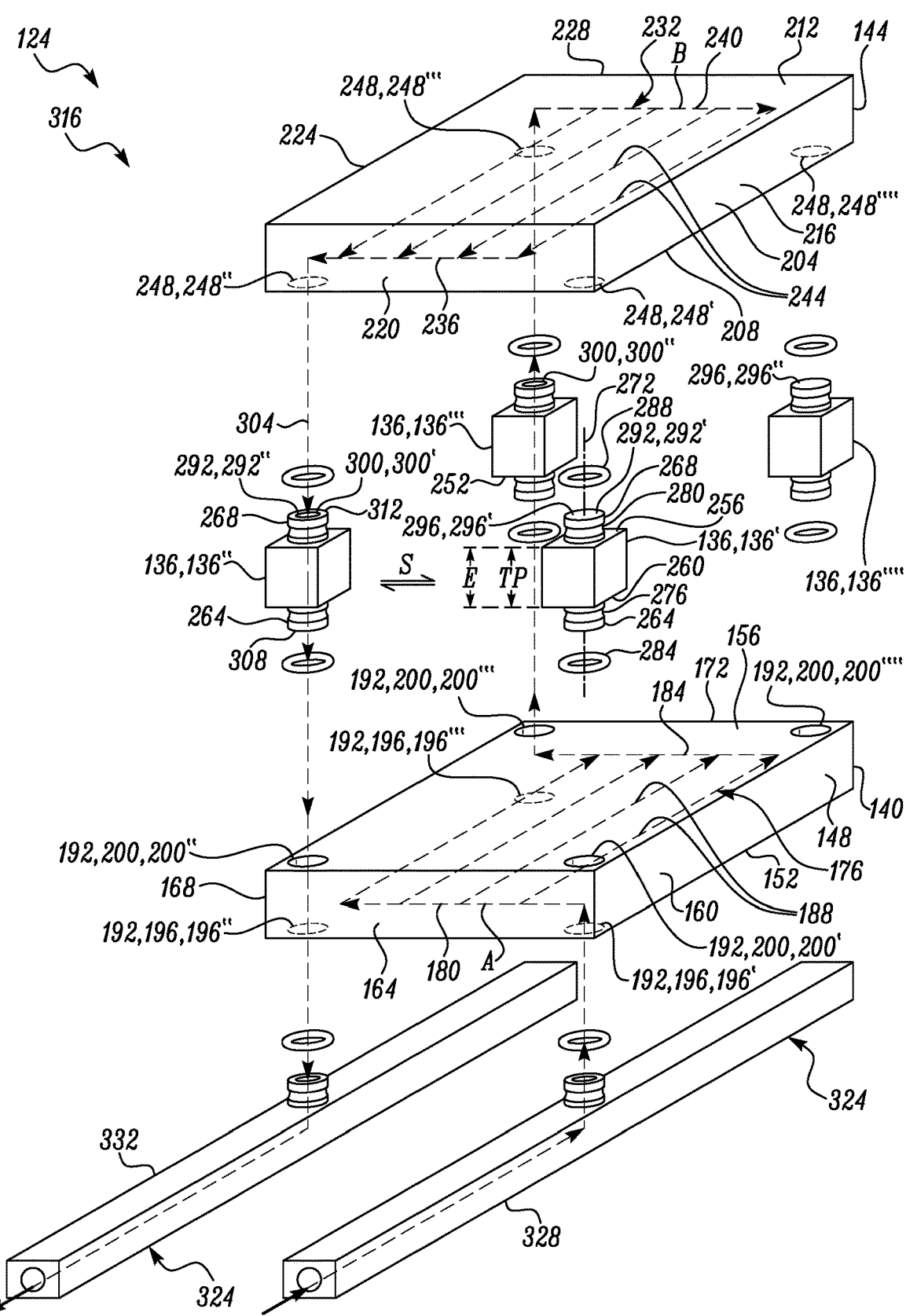
FIG. 2 is an exploded view of the cooling system, and which also illustrates an exemplary working of the cooling system in a first configuration, in accordance with an embodiment of the present disclosure.
Figure 3:
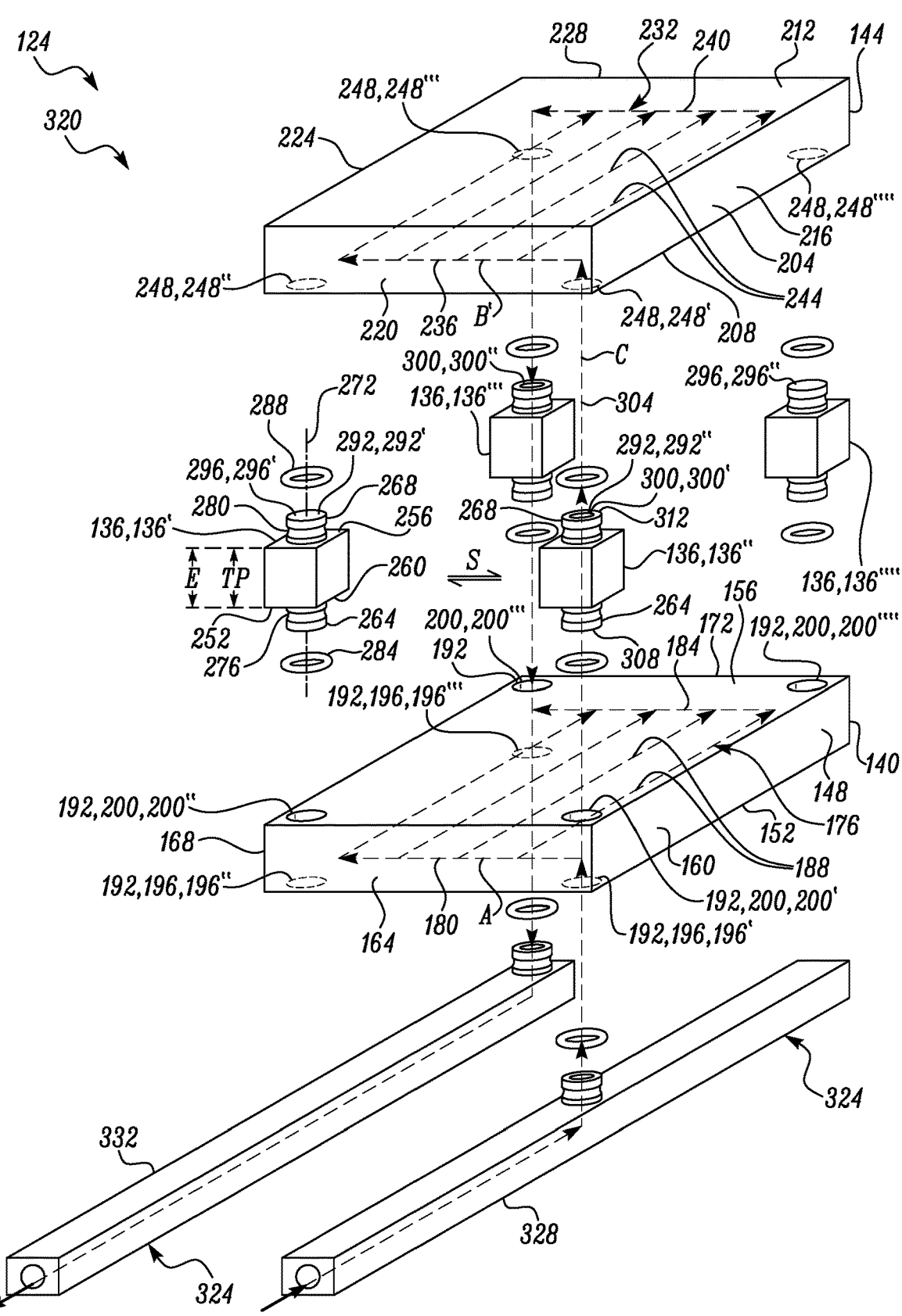
FIG. 3 is an exploded view of the cooling system, and which also illustrates an exemplary working of the cooling system in a second configuration, in accordance with an embodiment of the present disclosure.

Referring to FIGS. 2 and 3, the heatsink arrangement 132 includes a first heatsink 140 and a second heatsink 144. Each of the first heatsink 140 and the second heatsink 144 may be configured to receive the coolant flow and dissipate heat from the power modules 128 of the power electronics unit 116. In this regard, the first heatsink 140 may define a first body 148 made from a thermally conductive material to facilitate thermal dissipation. The first heatsink 140 may take the form of a cuboid shaped slab, e.g., one which may extend planarly, although those of skill in the art can contemplate various other shapes, sizes, and variations to a profile, pattern, and layout of the first heatsink 140, e.g., depending upon parameters like an extent of heat dissipation needed, the area of application of the first heatsink 140, spatial constraints in and around the power electronics unit 116, etc. As an example, the first heatsink 140 may define a first face 152 and a second face 156. The second face 156 may be disposed opposite to and away from the first face 152 and may also be spaced away from the first face 152. In some embodiments, the first face 152 may be parallel to the second face 156. Also, the first heatsink 140 may define side faces, e.g., a first side face 160, a second side face 164, a third side face 168, and a fourth side face 172.

The first heatsink 140 may define coolant flow passages (hereinafter referred to as first coolant flow passages 176) structured and arranged internally to the first body 148 of the first heatsink 140. As an example, the first coolant flow passages 176 may include a first main line 180, a second main line 184, and a number of interconnecting lines 188 extending (e.g., fluidly extending) between the first main line 180 and the second main line 184. As an example, the first main line 180 may extend along the second side face 164 of the first heatsink 140 and the second main line 184 may extend along the fourth side face 172 of the first heatsink 140. In general, the first coolant flow passages 176 may be structured and arranged within the first heatsink 140 to cover and/or extend across an overall expanse (e.g., a cuboidal expanse) of the first heatsink 140 such that as the coolant may flow through the first coolant flow passages 176, the coolant may efficiently dump heat (e.g., carried away from the power modules 128 of the power electronics unit 116) at the first heatsink 140.

The first heatsink 140 may define first openings 192. One or more of the first openings 192 may be defined on the first face 152, while the other first openings 192 may be defined on the second face 156. As an example, the first openings 192 that are defined on the first face 152 may be referred to as primary first openings 196 and the first openings 192 that are defined on the second face 156 may be referred to as secondary first openings 200. One or more of the primary first openings 196 and the secondary first openings 200 may be fluidly coupled with the first coolant flow passages 176 structured and arranged within the first heatsink 140, and such fluid coupling will be understood by way of the description and/or an operation of the cooling system 124 that will be described below. For the purposes of the present disclosure, the primary first openings 196 may be three (3) in number, namely primary first openings 196', 196", 196", and the secondary first openings 200 may be four (4) in number, namely secondary first openings 200', 200", 200"', 200"".

The second heatsink 144 may be similar, but not necessarily identical, to the first heatsink 140. The second heatsink 144 may define a second body 204 made from a thermally conductive material to facilitate thermal dissipation. As with the first heatsink 140, the second heatsink 144 may take the form of a cuboid shaped slab, e.g., one which may extend planarly, although those of skill in the art can contemplate various other shapes, sizes, and variations to a profile, pattern, and layout of the second heatsink 144, e.g., depending upon parameters like an extent of heat dissipation needed, the area of application of the second heatsink 144, spatial constraints in and around the power electronics unit 116, etc. Similarly to the first heatsink 140, the second heatsink 144 may define a first face 208 and a second face 212. The second face 212 may be disposed opposite to and away from the first face 208 and may also be spaced away from the first face 208. In some embodiments, the first face 208 may be parallel to the second face 212. Also, and as with the first heatsink 140, the second heatsink 144 may define side faces, e.g., a first side face 216, a second side face 220, a third side face 224, and a fourth side face 228.

The second heatsink 144 may define coolant flow passages (hereinafter referred to as second coolant flow passages 232) structured and arranged internally to the second body 204 of the second heatsink 144. As an example, the second coolant flow passages 232 may include a first main line 236, a second main line 240, and a number of interconnecting lines 244 extending (e.g., fluidly extending) between the first main line 236 and the second main line 240. As an example, the first main line 236 may extend along the second side face 220 of the second heatsink 144 and the second main line 240 may extend along the fourth side face 228 of the second heatsink 144. In general, the second coolant flow passages 232 may be structured and arranged within the second heatsink 144 to cover and/or extend across an overall expanse (e.g., a cuboidal expanse) of the second heatsink 144 such that as the coolant may flow through the second coolant flow passages 232, the coolant may efficiently dump heat (e.g., carried away from the power modules 128 of the power electronics unit 116) at the second heatsink 144.

The second heatsink 144 may define second openings 248. Unlike the layout of the first openings 192 on the first heatsink 140 on the first face 152 and the second face 156 of the first heatsink 140, the second openings 248 of the second heatsink 144 may be defined on the first face 208 of the second heatsink 144, and, although not limited, no second openings 248 may be present on the second face 212 of the second heatsink 144. One or more of the second openings 248 may be fluidly coupled with the second coolant flow passages 232 structured and arranged within the second heatsink 144, and such fluid coupling will be understood by way of the description and/or an operation of the cooling system 124 that will be described below. As an example, the second openings 248, as provided on the first face 208 of the second heatsink 144, may be four (4) in number, namely, second openings 248', 248", 248"', 248"".

The blocks 136 may be positioned between the first heatsink 140 and the second heatsink 144 and/or correspondingly between the first openings 192 (e.g., the secondary first openings 200) of the first heatsink 140 and the second openings 248 of the second heatsink 144. The blocks 136 may be generally correspondingly placed as an interface between one first opening 192 of the first heatsink 140 and one second opening 248 of the second heatsink 144. In this regard, the blocks 136 may be exemplarily four (4) in number (e.g., see a first block 136', a second block 136", a third block 136"', and a fourth block 136"") so as to be correspondingly placed at four (4) interfaces defined between the four (4) secondary first openings 200', 200", 200"', 200"" of the first heatsink 140 and the four (4) second openings 248', 248", 248"', 248"" of the second heatsink 144, although lesser or higher number of blocks may be applied between the first heatsink 140 and the second heatsink 144.

Although not limited, the blocks 136 may define a common thickness portion (see thickness portion, TP, annotated corresponding to a block portion 252 of the first block 136' and which may be the same as block portions of the other blocks 136) such that the first heatsink 140 and the second heatsink 144 may be spaced apart from each other by a constant gap, G (see FIG. 1)—for clarity, the block portion 252 of the first block 136' alone is marked. In some embodiments, one or more other aspects (e.g., dimensions, shape, and/or a profile) of the blocks 136 may be common and/or the same as well.

Continuing with the first block 136', the block portion 252 of the first block 136' may be cube shaped to define its corresponding thickness portion, TP, as shown. Those of skill in the art can contemplate various other shapes, sizes, and variations to a profile of the first block 136' and/or to the block portion 252 of the first block 136', and which may depend upon parameters like a space (e.g., the gap, G) available/needed between the first heatsink 140 and the second heatsink 144, etc. The block portion 252 of the first block 136' may define a top surface 256 and a bottom surface 260, and an elevation, E, of the block portion 252 may be defined between the top surface 256 and the bottom surface 260. Said elevation, E, may be the same as the thickness portion, TP, associated with the block portion 252 of the first block 136', as noted above. In some embodiments, the gap, G, defined between the first heatsink 140 and the second heatsink 144 may be equal to the thickness portion, TP, defined by the block portion 252.

The first block 136' may define a first shank segment 264 and a second shank segment 268. The first shank segment 264 may extend outwardly of the block portion 252 from the bottom surface 260 and the second shank segment 268 may extend outwardly of the block portion 252 from the top surface 256. Although not limited, the extensions of the both the first shank segment 264 and the second shank segment 268 outwardly of the block portion 252 as discussed above may be linear, e.g., along a linear axis 272. The first shank segment 264 may be mateable with (e.g., insertable into) the secondary first opening 200' of the first heatsink 140 and the second shank segment 268 may be mateable with (e.g., insertable into) the second opening 248' of the second heatsink 144.

In some embodiments, the first shank segment 264 and the second shank segment 268 may include corresponding grooves (e.g., see first groove 276 and a second groove 280). With regard to the first block 136', the first shank segment 264 and the second shank segment 268 may include O-rings (e.g., a first O-ring 284 and a second O-ring 288) mounted thereon (e.g., correspondingly into the first groove 276 and the second groove 280). By way of such mounting, when the first shank segment 264 and the second shank segment 268 may be correspondingly inserted into the secondary first opening 200' and the second opening 248, the first O-ring 284 may sealably couple the first shank segment 264 with the secondary first opening 200' and the second O-ring 288 may sealably couple the second shank segment 268 with the second opening 248.

In some embodiments, channels (not shown) (similar/complementary to the grooves 276, 280) may be correspondingly formed within a first wall defining the secondary first opening 200' of the first heatsink 140 and a second wall defining the second opening 248' of the second heatsink 144. In so doing, the first O-ring 284 and the second O-ring 288 can be respectively positioned and seated into such channels. As a result, a seal (e.g., a fluid seal) may be achieved between the first shank segment 264 and the secondary first opening 200', and, similarly, between the second shank segment 268 and the second opening 248 when the first block 136' is assembled to the first heatsink 140 and second heatsink 144. With the presence of such channels, it is possible in some cases for the grooves 276, 280 formed in the shank segments 264, 268 to be altogether omitted, and, instead of the O-rings 284, 288 being positioned into the grooves 276, 280, the O-rings 284, 288 may be seated into the channels.

The aforenoted discussions corresponding to the first O-ring 284, the second O-ring 288, the first shank segment 264, the second shank segment 268, and the block portion 252, may be suitably applicable for each of the other blocks 136 (e.g., the second block 136", the third block 136''', and the fourth block 136'''') and their connections with respect to the corresponding secondary first openings 200", 200''', 200'''' in the first heatsink 140 and the corresponding second openings 248", 248''', 248'''' in the second heatsink 144, as well. Also, the manner of achieving the seal (e.g., a fluid seal) between the blocks 136 and the heatsinks 140, 144, e.g., by use of the shank segments 264, 268 and/or O-rings 284, 288, as described above, are exemplary and those skilled in the art may contemplate various methods and/or alternatives to arrive at such seal based on the present disclosure.

Continuing with the first block 136', the first block 136' may further define a flow regulation feature 292 (e.g., a coolant flow regulation feature or a first flow regulation feature 292'). In the case of the first block 136', the first flow regulation feature 292' may include a flow restriction surface 296. The flow restriction surface 296 may restrict the coolant flow from flowing therethrough, e.g., through the first shank segment 264, the block portion 252, and the second shank segment 268. Therefore, when the first block 136' is assembled to the first heatsink 140 and the second heatsink 144, i.e., when the first shank segment 264 is mated (or inserted into) the secondary first opening 200' and when the second shank segment 268 is mated (or inserted into) the second opening 248', any coolant flow between the secondary first opening 200' and the second opening 248' is restricted or disallowed.

As with the first block 136', similar discussions may be applied to the fourth block 136'''' as well. For example, the fourth block 136'''' may include the same structure and/or configuration as the first block 136'. More particularly, the fourth block 136'''' may include or define a first flow regulation feature or a flow restriction surface (similar to the first flow regulation feature 292' or the flow restriction surface 296 of the first block 136') to restrict the coolant flow from flowing therethrough.

With regard to the second block 136" now, the second block 136" may define another flow regulation feature 292 (e.g., a coolant flow regulation feature or a second flow regulation feature 292" which may be different from the first flow regulation feature 292'). In the case of the second block 136", the second flow regulation feature 292" may include a through-passage 300. The through-passage 300 may allow the coolant flow to pass therethrough, e.g., through the first shank segment 264 of the second block 136", the block portion 252 of the second block 136", and the second shank segment 268 of the second block 136". Therefore, when the second block 136" is assembled to the first heatsink 140 and the second heatsink 144, i.e., when the first shank segment 264 of the second block 136" is mated (or inserted into) the secondary first opening 200" and when the second shank segment 268 of the second block 136" is mated (or inserted into) the second opening 248", coolant flow between the secondary first opening 200" and the second opening 248" may be allowed.

In some embodiments, the second flow regulation feature 292" or the through-passage 300 may extend across and/or be defined (e.g., linearly along a common linear axis 304) through each of the first shank segment 264 of the second block 136'', the block portion 252 of the second block 136'', and the second shank segment 268 of the second block 136''. In so doing, the through-passage 300 may be open to corresponding ends 308, 312 defined by the first shank segment 264 (of the second block 136'') and the second shank segment 268 (of the second block 136'').

As with the second block 136'', similar discussions may be applied to the third block 136'', as well. As an example, the third block 136''' may include the same structure and/or configuration as the second block 136''. More particularly, the third block 136''' may include or define a second flow regulation feature or a through-passage (similar to the second flow regulation feature 292'' or the through-passage 300) to allow the coolant flow to pass therethrough.

In brevity, each of the blocks 136 may define a flow regulation feature 292, e.g., either the through-passage 300 or the flow restriction surface 296, such that coolant flows correspondingly between the secondary first openings 200 of the first heatsink 140 and the second openings 248 of the second heatsink 144 can be selectively routed and restricted. As noted above, the flow regulation feature 292 may include either a through-passage 300 (see second through-passage 300' and third through-passage 300'' respectively associated with the second block 136'' and the third block 136''' in FIGS. 2 and 3) or a flow restriction surface 296 (see first flow restriction surface 296' and fourth flow restriction surface 296'' respectively associated with the first block 136' and fourth block 136'''' in FIGS. 2 and 3). Moreover, when the flow regulation feature 292 includes the through-passage 300, the through-passage 300 is defined through the first shank segment 264 and the second shank segment 268. Alternatively, when the flow regulation feature 292 includes the flow restriction surface 296, the flow restriction surface 296 is defined, at least in part, by corresponding surfaces or ends of each of the first shank segment 264 and the second shank segment 268.

Also, in this case, it may be appreciated that FIG. 2 includes an illustration according to which the blocks 136 may be arranged in between the first heatsink 140 and the second heatsink 144 according to a first configuration 316 of the cooling system 124. FIG. 3, conversely, includes an illustration according to which the blocks 136 may be arranged in between the first heatsink 140 and the second heatsink 144 according to a second configuration 320 of the cooling system 124. The second configuration 320 may be different from the first configuration 316 of the cooling system 124. In other words, the arrangement of the blocks 136 in between the first heatsink 140 and the second heatsink 144 may be different in the first configuration 316 and in the second configuration 320. In the first configuration 316, the first heatsink 140 and the second heatsink 144 may be fluidly connected to each other to receive the coolant flow according to a series flow, and, in the second configuration 320, the first heatsink 140 and the second heatsink 144 may be fluidly connected to each other to receive the coolant flow according to a parallel flow.

Further, as shown in FIGS. 2 and 3, the cooling system 124 also includes a coolant manifold assembly 324. The coolant manifold assembly 324 may be configured to route coolant into and out of the heatsink arrangement 132, during operations. In this regard, the coolant manifold assembly 324 may be fluidly coupled to one (or more) of the first heatsink 140 and the second heatsink 144 of the heatsink arrangement 132. More particularly, the coolant manifold assembly 324 may include a first manifold 328 and a second manifold 332, as shown. The first manifold 328 and the second manifold 332 may be spaced apart from each other.

In the case of the first configuration 316, as shown in FIG. 2, the first manifold 328 may be configured to allow coolant inflow (e.g., a forced coolant inflow induced by a pumping action of a pump) into the first heatsink 140 (e.g., through the primary first opening 196') and the second heatsink 144 (through the second opening 248'''') and the second manifold 332 may be configured to allow coolant outflow from the first heatsink 140 (e.g., through the secondary first opening 200'' and the primary first opening 196'') and the second heatsink 144 (e.g., through the second opening 248'').

In the case of the second configuration 320, as shown in FIG. 3, the first manifold 328 may be configured to allow coolant inflow (e.g., a forced coolant inflow induced by a pumping action of a pump) into the first heatsink 140 (e.g., through the primary first opening 196') and the second heatsink 144 (through the second opening 248') and the second manifold 332 may be configured to allow coolant outflow from the first heatsink 140 (e.g., through the secondary first opening 200''' and primary first opening 196''') and the second heatsink 144 (e.g., through the second opening 248''').

As an exemplary configuration of the cooling system 124, the second heatsink 144 is positioned above or at an elevation with respect to the first heatsink 140. Further, the coolant manifold assembly 324 may be positioned under the heatsink arrangement 132. Moreover, the coolant manifold assembly 324 may define a first section 336 (see FIG. 1) with the heatsink arrangement 132 being arranged over the first section 336. Furthermore, the coolant manifold assembly 324 may define a second section 340 (see FIG. 1) with the power modules 128 being arranged over the second section 340. Therefore, the coolant manifold assembly 324 may serve as a structural member to support the heatsink arrangement 132. In that manner, the power modules 128, at least in part, may adjoin or are connected to the heatsink arrangement 132 optimizing an overall packaging associated with the cooling system 124. Also, the power modules 128 and the heatsink arrangement 132 are supported on the coolant manifold assembly 324 in a space efficient manner.

The arrangement of the first heatsink 140 and the second heatsink 144 with the first manifold 328 and the second manifold 332, as described above, are to be viewed as exemplary. In this regard, it will be appreciated that one or more (or both) of the first manifold 328 and/or the second manifold 332 may be provided elsewhere, as well, and they need not necessarily be positioned under the heatsink arrangement 132 as exemplarily shown and/or discussed above. As an example, and in some embodiments, one or more (or both) of the first manifold 328 and/or the second manifold 332 may be provided above the heatsink arrangement 132. In some embodiments, one or more (or both) of the first manifold 328 and/or the second manifold 332 may be provided in between the first heatsink 140 and the second heatsink 144.

Such variations in the arrangement and/or configuration of various parts of the cooling system 124 may be considered or contemplated according to factors, such as an area of application of the cooling system 124, spatial constraints within or around the cooling system 124, size of the cooling system 124, etc. Further, a working of such arrangements and/or configurations of the cooling system 124 (e.g., involving a coolant flow either in parallel or in series) may be contemplated by someone skilled in the art based on the present disclosure. Effectively, the cooling system 124 may be varied and/or split between various arrangements and/or configurations.

In some embodiments, one or more (or both) the first manifold 328 and the second manifold 332 may carry coolant for additional heat generating components, such as capacitors, magnetic devices, etc., as well. In other words, the coolant manifold assembly 324, which may serve as a structural member to support the heatsink arrangement 132, may also interface with one or more other heat-generating components, allowing some coolant flow to be applied to cool those components, as well. Also, it may be noted that additional heatsinks may be provided in conjunction with the first heatsink 140 and the second heatsink 144, e.g., for increasing a capacity of the cooling system 124.

INDUSTRIAL APPLICABILITY

Referring to FIGS. 2 and 3, during an assembly and/or a manufacturing of the power electronics unit 116 and/or of the cooling system 124 of the power electronics unit 116, the heatsink arrangement 132, i.e., the first heatsink 140 and the second heatsink 144, may be used/applied. For example, the second heatsink 144 may be positioned at an elevation with respect to the first heatsink 140. Further, the blocks 136 may be positioned and/or arranged in between the first heatsink 140 and the second heatsink 144. In addition, the coolant manifold assembly 324 may be fluidly coupled to the first heatsink 140 (and thus also to the second heatsink 144). If the heatsink arrangement 132 were to allow the coolant flow in series, e.g., the first heatsink 140 and the second heatsink 144 were to be fluidly connected to each other to receive the coolant flow according to the series flow, the blocks 136 may be arranged according to the first configuration 316, as illustrated in FIG. 2.

In the first configuration 316, the first block 136' (or the first flow restriction surface 296') may be positioned between the secondary first opening 200' and the second opening 248'; the second block 136" (or the second through-passage 300') may be positioned between the secondary first opening 200" and the second opening 248"; the third block 136''' (or the third through-passage 300") may be positioned between the secondary first opening 200''' and the second opening 248'''; and the fourth block 136'''' (or the fourth flow restriction surface 296") may be positioned between the secondary first opening 200'''' and the second opening 248''''.

Effectively, in the first configuration 316, as the first block 136' may define the first flow restriction surface 296', the first block 136' may restrict coolant flow therethrough and disallow coolant flow between the secondary first opening 200' and the second opening 248'. As the second block 136" may define the second through-passage 300', the second block 136" may allow coolant flow therethrough and between the secondary first opening 200" and the second opening 248". As the third block 136''' may define the third through-passage 300", the third block 136''' may allow coolant flow therethrough and between the secondary first opening 200" and the second opening 248'''. Further, as the fourth block 136'''' may define the fourth flow restriction surface 296", the fourth block 136'''' may restrict coolant flow therethrough and disallow coolant flow between the secondary first opening 200'''' and the second opening 248''''.

During a working of the heatsink arrangement 132 in the first configuration 316, coolant may extract heat from the power modules 128 (e.g., through the heat dissipating structure) and may pass through the first manifold 328 and then flow into the first heatsink 140 through the primary first opening 196' of the first heatsink 140. As in the first configuration 316 the first block 136' includes the flow regulation feature 292 as the first flow restriction surface

296', coolant flow is restricted from moving through the first block 136' and is thus diverted into the first coolant flow passages 176 of the first heatsink 140 (see direction, A, FIG. 2). The inflowing coolant then travels through the first coolant flow passages 176 up to the secondary first opening 200''' of the first heatsink 140. As the third block 136''', positioned in fluid coupling to the secondary first opening 200''', includes the third through-passage 300", the coolant flow may be pushed out of the first heatsink 140 through the secondary first opening 200''' and may be routed further through the third through-passage 300" formed in the third block 136'''. As the third block 136''' is also fluidly coupled with the second opening 248''' of the second heatsink 144, the coolant flows into the second heatsink 144 through said second opening 248'''.

As coolant enters into the second heatsink 144, coolant flow is diverted into the second coolant flow passages 232 of the second heatsink 144 (see direction, B, FIG. 2). The inflowing coolant then travels through the second coolant flow passages 232 up to the second opening 248" of the second heatsink 144. Owing to a continued inflowing coolant pressure, the coolant flow is pushed out of the second heatsink 144 through the second opening 248". As the second block 136", positioned in fluid coupling to the second opening 248", includes the second through-passage 300', the coolant flow may be pushed out of the second heatsink 144 through said second opening 248" and the second through-passage 300' and may be routed further through the secondary first opening 200" and the primary first opening 196" of the first heatsink 140 to be drained out into the second manifold 332. At this point, the coolant flow may be ready for executing a next cycle of circulation back to the heat dissipation structure in order to extract additional heat from the power modules 128 via the heat dissipation structure.

Conversely, if the heatsink arrangement 132 were to allow the coolant flow in parallel, e.g., the first heatsink 140 and the second heatsink 144 were to be fluidly connected to each other to receive the coolant flow according to the parallel flow, the blocks 136 may be arranged according to the second configuration 320 as is illustrated in FIG. 3. In this regard, it may be noted that during an assembly or a manufacturing of the power electronics unit 116 and/or of the cooling system 124, the first block 136' may be simply swapped (see direction, S, FIGS. 2 and 3) with the second block 136" to interchange locations of the first flow regulation feature 292 (e.g., the first flow restriction surface 296' of the first block 136') with the second flow regulation feature 292" (e.g., the second through-passage 300' of the second block) to in turn switch (e.g., easily switch) the cooling system 124 between the first configuration 316 (FIG. 2) and the second configuration 320 (FIG. 3).

Therefore, in the second configuration 320, as the first block 136' (now positioned at the location of the second block 136" in the first configuration 316) may define the first flow restriction surface 296', the first block 136' may restrict coolant flow between the secondary first opening 200" and the second opening 248", and, in other words, may disallow coolant to flow between the secondary first opening 200" and the second opening 248". Further, as the second block 136" (now positioned at the location of the first block 136' in the first configuration 316) may define the second through-passage 300', the second block 136" may allow coolant flow therethrough and therefore allow coolant flow between the secondary first opening 200' and the second opening 248'. Remaining aspects (e.g., remaining functional aspects) of the second configuration 320 may remain similar to that discussed for the first configuration 316.

During a working of the cooling system 124 (and/or the heatsink arrangement 132) in the second configuration 320, coolant may extract heat from the power modules 128 (e.g., through the heat dissipating structure) and may pass through the first manifold 328 and then flow into the first heatsink 140 through the primary first opening 196' of the first heatsink 140. As in the second configuration 320, the second block 136" includes the flow regulation feature 292 as the second through-passage 300', coolant flow is allowed to move through the second through-passage 300' and thus into the second heatsink 144 through the second opening 248' (see direction, C, FIG. 3). The coolant then enters into the second coolant flow passages 232 of the second heatsink 144. A part of such a coolant flow is also diverted into the first coolant flow passages 176 of the first heatsink 140 (see direction, A, FIG. 3). Effectively, portions (e.g., a first coolant portion and a second coolant portion) of the inflowing coolant is respectively passed into both the first heatsink 140 and the second heatsink 144, parallelly.

As a portion (e.g., the second coolant portion) of the coolant flows into the second heatsink 144, coolant flow is diverted into the second coolant flow passages 232 of the second heatsink 144 (see direction, B', FIG. 3). The inflowing coolant then travels up to the second opening 248''' of the second heatsink 144. Owing to a continued inflowing coolant pressure, the coolant flow is pushed out of the second heatsink 144 through the second opening 248'''. As the third block 136''', positioned in fluid coupling to the second opening 248''', includes the third through-passage 300'', the coolant flow may be pushed out of the second heatsink 144 through said second opening 248''' and the third through-passage 300''. Coolant may be then routed further through the secondary first opening 200''' and the primary first opening 196''' of the first heatsink 140 to be drained out into the second manifold 332 of the coolant manifold assembly 324.

The other portion (e.g., the first coolant portion) of the coolant, flowing through the first coolant flow passages 176 of the first heatsink 140 (see direction, A), travels up to the secondary first opening 200''' of the first heatsink 140. Reaching up to the secondary first opening 200''', said first coolant portion may drain out of the first heatsink 140 into the second manifold 332 through the secondary first opening 200''' and the primary first opening 196''' of the first heatsink 140. At this point, the first coolant portion may merge with the second coolant portion draining out through the third through-passage 300'', such that both the first coolant portion and the second coolant portion may drain out of the first heatsink 140 and the second heatsink 144 together and or via a common route. As the coolant exits the heatsink arrangement 132, the coolant flow may become ready for executing a next cycle of circulation back to the heat dissipation structure to extract additional heat from the power modules 128 via the heat dissipation structure.

Figure 4:
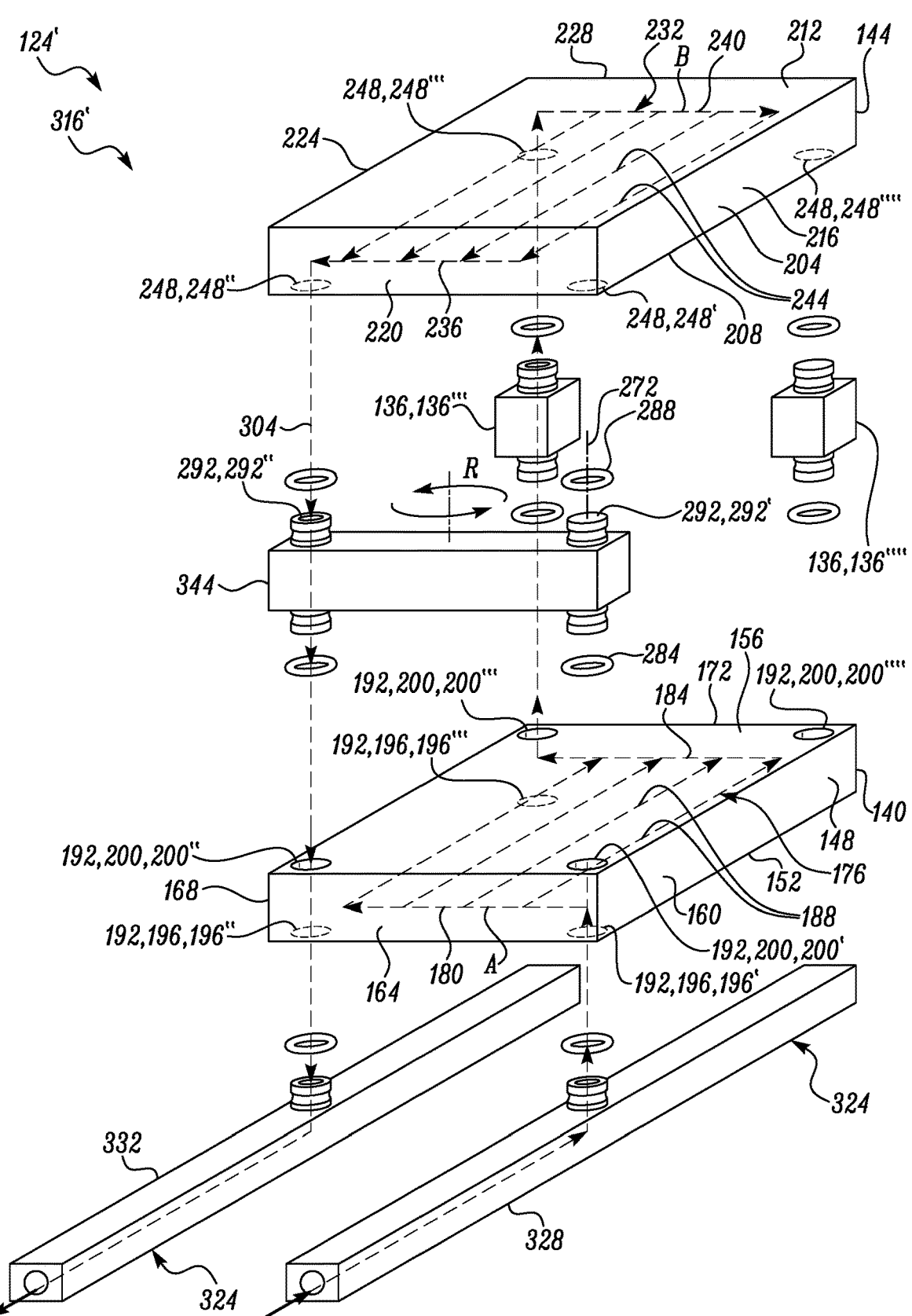
FIG. 4 is an exploded view of an alternate cooling system, and which also illustrates an exemplary working of the alternate cooling system in a corresponding first configuration, in accordance with an embodiment of the present disclosure.
Figure 5:
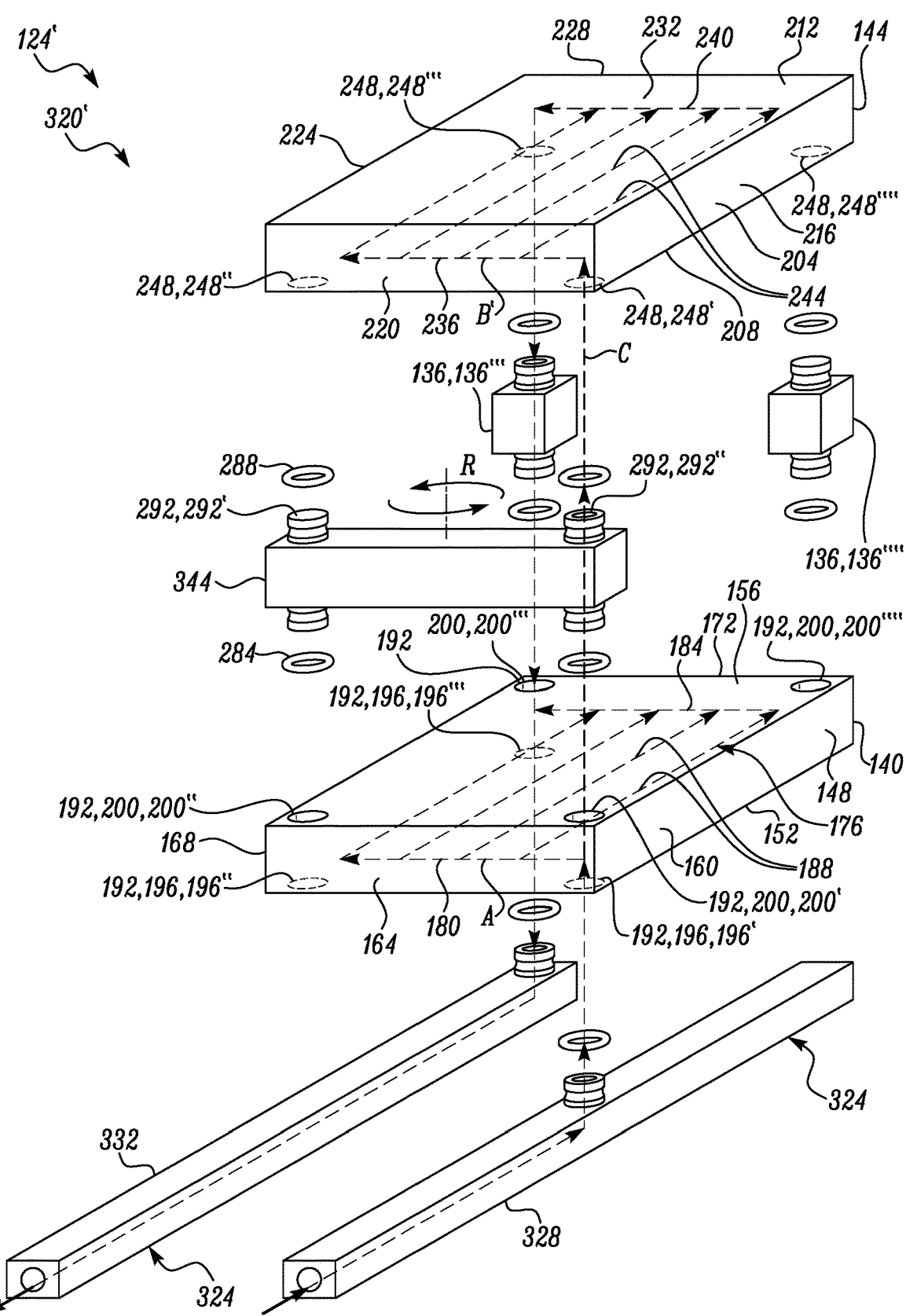
FIG. 5 is an exploded view of the alternate cooling system of FIG. 4, and which also illustrates an exemplary working of the alternate cooling system in a corresponding second configuration, in accordance with another embodiment of the present disclosure.

Referring to FIGS. 4 and 5 now, an example variation in the blocks 136 is discussed by way of a cooling system 124'. Wherever possible same or similar reference numerals have been used for the cooling system 124' as have been used for the cooling system 124. With regard to the variation in the cooling system 124', the first block 136' and the second block 136" of the cooling system 124' may be fixedly connected to one another to form an integral block piece 344, as shown. As with the cooling system 124, the cooling system 124' may also be switched between a first configuration 316' (in which heatsinks 140, 144 of the cooling system 124' are fluidly connected to each other to receive the coolant flow according to a series flow) (see FIG. 4) and a second configuration 320' (in which heatsinks 140, 144 of the cooling system 124' are fluidly connected to each other to receive the coolant flow according to a parallel flow) (see FIG. 5).

In further detail, to switch the cooling system 124' between the first configuration 316' and the second configuration 320', the integral block piece 344 may be reoriented (see direction, R, FIGS. 4 and 5) such that locations of the first flow regulation feature 292' and the second flow regulation feature 292" can be interchanged with each other to switch the cooling system 124' between the first configuration 316' and the second configuration 320'. It may be noted that the first configuration 316' may have similar functionality as the first configuration 316 of the cooling system 124 and the second configuration 320' may have similar functionality as the second configuration 320 of the cooling system 124. Effectively, in such a case, the first block 136' being swappable with the second block 136" may correspond to the integral block piece 344 being reorientable such that locations of the first flow regulation feature 292' and the second flow regulation feature 292" can be interchanged with each other. Other aspects (including parts and functionality) of the cooling system 124', as illustrated in FIGS. 4 and 5, may remain similar to that discussed for the cooling system 124.

Apart from integrating and/or bringing together the power modules 128 and the heatsink arrangement 132 into a common power electronics unit (i.e., the power electronics unit 116) the cooling systems 124, 124' of the power electronics unit 116 can be readily configured for accepting coolant in either series or in parallel during manufacturing. Such a provision increases flexibility and ease in manufacturability.

More particularly, the ability to swap the first block 136' and the second block 136" in the cooling system 124 and/or reorient the integral block piece 344 in the cooling system 124", allows a location of the first flow regulation feature 292' to be easily interchanged with a location of the second flow regulation feature 292". This enables similar components to be applied for assembling and manufacturing different configurations of the cooling systems 124, 124'. With use of similar components, an associated manufacturing practice can reduce its dependence on multiple products and/or components, which are otherwise arduous to procure, store, and maintain. The cooling systems 124, 124', therefore, effectively helps optimize parts/component inventory. Additionally, with use of similar components, e.g., the blocks 136, the time needed to manufacture the cooling systems 124, 124', is also significantly reduced. Overall costs and complexity involved in the assembling and/or the manufacturing process is also mitigated.

Further, it may be noted that the ability to swap the first block 136' with the second block 136" is exemplarily, and thus multiple blocks 136 of the cooling systems 124, 124' may be swapped with multiple other blocks 136 in a variety of ways to arrive at any desired configuration of the cooling systems 124, 124'. Such swapping may depend upon parameters such as an area of application of the cooling system 124, 124', a type of cooling needed, etc.

Unless explicitly excluded, the use of the singular to describe a component, structure, or operation does not exclude the use of plural such components, structures, or operations or their equivalents. The use of the terms "a" and "an" and "the" and "at least one" or the term "one or more," and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B" or one or more of A and B") is to be construed to mean one item selected from the listed items (A or B) or any combination of two or more of the listed items (A and B; A, A and B; A, B and B), unless otherwise indicated herein or clearly contradicted by context. Similarly, as used herein, the word "or" refers to any possible permutation of a set of items. For example, the phrase "A, B, or C" refers to at least one of A, B, C, or any combination thereof, such as any of: A; B; C; A and B; A and C; B and C; A, B, and C; or multiple of any item such as A and A; B, B, and C; A, A, B, C, and C; etc.

It will be apparent to those skilled in the art that various modifications and variations can be made to the method and/or system of the present disclosure without departing from the scope of the disclosure. Other embodiments will be apparent to those skilled in the art from consideration of the specification and practice of the method and/or system disclosed herein. It is intended that the specification and examples be considered as exemplary only, with a true scope of the disclosure being indicated by the following claims and their equivalent.

What is claimed is:

1. A cooling system for a power electronics unit, the cooling system comprising:

a heatsink arrangement including a first heatsink and a second heatsink, each of the first heatsink and the second heatsink configured to receive a coolant flow and dissipate heat from one or more power modules of the power electronics unit, the first heatsink including a plurality of first openings and the second heatsink including a plurality of second openings; and a plurality of blocks positioned between the first heatsink and the second heatsink, each block of the plurality of blocks defining a flow regulation feature such that coolant flows correspondingly between the plurality of first openings and the plurality of second openings is selectively routed and restricted, wherein at least one block of the plurality of blocks is swappable with at least one other block of the plurality of blocks to interchange locations of a first flow regulation feature of the at least one other block with a second flow regulation feature of the at least one another block to switch the cooling system between a first configuration and a second configuration, and in the first configuration, the first heatsink and the second heatsink are fluidly connected to each other to receive the coolant flow according to a series flow, and, in the second configuration, the first heatsink and the second heatsink are fluidly connected to each other to receive the coolant flow according to a parallel flow.

2. The cooling system of claim 1, wherein the first flow regulation feature is different from the second flow regulation feature, and the first flow regulation feature includes a through-passage to allow coolant flow therethrough and the second flow regulation feature includes a flow restriction surface to restrict coolant flow therethrough.

3. The cooling system of claim 2, wherein wherein each block defines a first shank segment and a second shank segment, the first shank segment being mateable with a corresponding first opening of the plurality of first openings, the second shank segment being mateable with a corresponding second opening of the plurality of second openings, each of the first shank segment and the second shank segment including corresponding O-rings mounted thereon for sealably coupling the first shank segment with the corresponding first opening and for sealably coupling the second shank segment with the corresponding second opening, and when the flow regulation feature includes the through-passage, the through-passage is defined through the first shank segment and the second shank segment, and when the flow regulation feature includes the flow restriction surface, the flow restriction surface is defined, at least in part, by corresponding surfaces of each of the first shank segment and the second shank segment.

4. The cooling system of claim 1 further comprising a coolant manifold assembly fluidly coupled to one of the first heatsink and the second heatsink, the coolant manifold assembly having a first manifold and a second manifold spaced apart from the first manifold, the first manifold configured to allow coolant inflow into the first heatsink and the second heatsink and the second manifold configured to allow coolant outflow from the first heatsink and the second heatsink.

5. The cooling system of claim 4, wherein the coolant manifold assembly defines a first section, the heatsink arrangement being arranged over the first section, the coolant manifold assembly defines a second section, the one or more power modules being arranged over the second section, and the one or more power modules, at least in part, adjoin or is connected to the heatsink arrangement.

6. The cooling system of claim 1, wherein the second heatsink is positioned above or at an elevation with respect to the first heatsink.

7. The cooling system of claim 1, wherein the at least one block is fixedly connected to the at least one another block to form an integral block piece, and the at least one block being swappable with the at least one another block corresponds to the integral block piece being reorientable such that locations of the first flow regulation feature and the second flow regulation feature are interchanged with each other.

8. A method for assembling a cooling system for a power electronics unit, the method comprising:

using a heatsink arrangement including a first heatsink and a second heatsink, each of the first heatsink and the second heatsink configured to receive a coolant flow and dissipate heat from one or more power modules of the power electronics unit, the first heatsink including a plurality of first openings and the second heatsink including a plurality of second openings; and positioning a plurality of blocks between the first heatsink and the second heatsink, each block of the plurality of blocks defining a flow regulation feature such that coolant flows correspondingly between the plurality of first openings and the plurality of second openings is selectively routed and restricted, wherein at least one block of the plurality of blocks is swappable with at least one other block of the plurality of blocks to interchange locations of a first flow regulation feature of the at least one block with a second flow regulation feature of the at least one other block to switch the cooling system between a first configuration and a second configuration, and in the first configuration, the first heatsink and the second heatsink are fluidly connected to each other to receive the coolant flow according to a series flow, and, in the second configuration, the first heatsink and the second heatsink are fluidly connected to each other to receive the coolant flow according to a parallel flow.

9. The method of claim 8, wherein the first flow regulation feature is different from the second flow regulation feature, and the first flow regulation feature includes a through-passage to allow coolant flow therethrough and the second flow regulation feature includes a flow restriction surface to restrict coolant flow therethrough.

10. The method of claim 9, wherein wherein each block defines a first shank segment and a second shank segment, the first shank segment being mateable with a corresponding first opening of the plurality of first openings, the second shank segment being mateable with a corresponding second opening of the plurality of second openings, each of the first shank segment and the second shank segment including corresponding O-rings mounted thereon for sealably coupling the first shank segment with the corresponding first opening and for sealably coupling the second shank segment with the corresponding second opening, and when the flow regulation feature includes the through-passage, the through-passage is defined through the first shank segment and the second shank segment, and when the flow regulation feature includes the flow restriction surface, the flow restriction surface is defined, at least in part, by corresponding surfaces of each of the first shank segment and the second shank segment.

11. The method of claim 8 further comprising:

fluidly coupling a coolant manifold assembly to one of the first heatsink and the second heatsink, the coolant manifold assembly having a first manifold and a second manifold spaced apart from the first manifold, the first manifold configured to allow coolant inflow into the first heatsink and the second heatsink and the second manifold configured to allow coolant outflow from the first heatsink and the second heatsink.

12. The method of claim 11, wherein the coolant manifold assembly defines a first section and a second section, the method further including:

arranging the heatsink arrangement over the first section and the one or more power modules over the second section to adjoin or connect the one or more power modules, at least in part, to the heatsink arrangement.

13. The method of claim 8, wherein using the heatsink arrangement includes positioning the second heatsink above or at an elevation with respect to the first heatsink.

14. The method of claim 8, wherein the at least one block is fixedly connected to the at least one another block to form an integral block piece, and the at least one block being swappable with the at least one another block corresponds to the integral block piece being reorientable such that locations of the first flow regulation feature and the second flow regulation feature are interchanged with each other.

15. A machine, comprising:

at least one power producing device and at least one power consuming device;

a power electronics unit configured to convert and condition a flow of electrical current between the at least one power producing device and the at least one power consuming device, the power electronics unit, including:

one or more power modules; and a cooling system to maintain a working temperature of the one or more power modules of the power electronics unit, the cooling system including:

a heatsink arrangement including a first heatsink and a second heatsink, each of the first heatsink and the second heatsink configured to receive a coolant flow and dissipate heat from the one or more power modules of the power electronics unit, the first heatsink including a plurality of first openings and the second heatsink including a plurality of second openings; and a plurality of blocks positioned between the first heatsink and the second heatsink, each block of the plurality of blocks defining a flow regulation feature such that coolant flows correspondingly between the plurality of first openings and the plurality of second openings is selectively routed and restricted, wherein at least one block of the plurality of blocks is swappable with at least one other block of the plurality of blocks to interchange locations of a first flow regulation feature of the at least one block with a second flow regulation feature of the at least one other block to switch the cooling system between a first configuration and a second configuration, and in the first configuration, the first heatsink and the second heatsink are fluidly connected to each other to receive the coolant flow according to a series flow, and, in the second configuration, the first heatsink and the second heatsink are fluidly connected to each other to receive the coolant flow according to a parallel flow.

16. The machine of claim 15, wherein the first flow regulation feature is different from the second flow regulation feature, and the first flow regulation feature includes a through-passage to allow coolant flow therethrough and the second flow regulation feature includes a flow restriction surface to restrict coolant flow therethrough.

17. The machine of claim 16, wherein wherein each block defines a first shank segment and a second shank segment, the first shank segment being mateable with a corresponding first opening of the plurality of first openings, the second shank segment being mateable with a corresponding second opening of the plurality of second openings, each of the first shank segment and the second shank segment including corresponding O-rings mounted thereon for sealably coupling the first shank segment with the corresponding first opening and for sealably coupling the second shank segment with the corresponding second opening, and when the flow regulation feature includes the through-passage, the through-passage is defined through the first shank segment and the second shank segment, and when the flow regulation feature includes the flow restriction surface, the flow restriction surface is defined, at least in part, by corresponding surfaces of each of the first shank segment and the second shank segment.

18. The machine of claim 15 further comprising a coolant manifold assembly fluidly coupled to one of the first heatsink and the second heatsink, the coolant manifold assembly having a first manifold and a second manifold spaced apart from the first manifold, the first manifold configured to allow coolant inflow into the first heatsink and the second heatsink and the second manifold configured to allow coolant outflow from the first heatsink and the second heatsink, wherein the coolant manifold assembly defines a first section, the heatsink arrangement being arranged over the first section, the coolant manifold assembly defines a second section, the one or more power modules being arranged over the second section, and the one or more power modules, at least in part, adjoin or is connected to the heatsink arrangement.

19. The machine of claim 15, wherein the second heatsink is positioned above or at an elevation with respect to the first heatsink.

20. The machine of claim 15, wherein the at least one block is fixedly connected to the at least one another block to form an integral block piece, and the at least one block being swappable with the at least one another block corresponds to the integral block piece being reorientable such that locations of the first flow regulation feature and the second flow regulation feature are interchanged with each other.

\* \* \* \* \*